(12) United States Patent
Bryden et al.

(10) Patent No.: US 8,603,581 B2
(45) Date of Patent: Dec. 10, 2013

(54) MANUFACTURE OF N-TYPE CHALCOGENIDE COMPOSITIONS AND THEIR USES IN PHOTOVOLTAIC DEVICES

(75) Inventors: Todd R. Bryden, Midland, MI (US); Buford I. Lemon, Willow Grove, PA (US); Joseph George, Midland, MI (US); Rebekah Kristine-Ligman Feist, Midland, MI (US)

(73) Assignee: Dow Global Technologies LLC, Midland, MN (US)

( * ) Notice: Subject to any disclaimer, the term of this patent is extended or adjusted under 35 U.S.C. 154(b) by 317 days.

(21) Appl. No.: 12/912,205

(22) Filed: Oct. 26, 2010

(65) Prior Publication Data

US 2011/0100460 A1    May 5, 2011

Related U.S. Application Data

(60) Provisional application No. 61/258,416, filed on Nov. 5, 2009.

(51) Int. Cl.
*C23C 16/40*    (2006.01)

(52) U.S. Cl.
USPC .............. 427/255.28; 427/255.29; 427/255.31

(58) Field of Classification Search
USPC ........................ 427/255.28, 255.29, 255.31
See application file for complete search history.

(56) References Cited

U.S. PATENT DOCUMENTS

| | | | |
|---|---|---|---|
| 3,418,229 A | | 12/1968 | Lakshmanan et al. |
| 3,811,953 A | | 5/1974 | Nozik |
| 4,064,522 A | * | 12/1977 | Shaw et al. .................. 136/260 |
| 4,207,119 A | * | 6/1980 | Tyan ............................ 136/258 |
| 4,269,919 A | * | 5/1981 | Kuehnle ........................ 430/67 |
| 4,842,897 A | * | 6/1989 | Takeuchi et al. ......... 427/255.35 |
| 4,954,874 A | * | 9/1990 | Miura ........................... 257/668 |
| 5,078,804 A | | 1/1992 | Chen et al. |
| 5,261,968 A | * | 11/1993 | Jordan ......................... 136/244 |
| 5,916,375 A | * | 6/1999 | Agui et al. .................... 136/258 |
| 2004/0103936 A1 | * | 6/2004 | Andriessen ................... 136/252 |
| 2005/0009228 A1 | | 1/2005 | Wu et al. |
| 2005/0186342 A1 | | 8/2005 | Sager et al. |
| 2005/0224111 A1 | | 10/2005 | Cunningham et al. |
| 2006/0255351 A1 | | 11/2006 | Ryu et al. |
| 2007/0264504 A1 | * | 11/2007 | Mitzi et al. ................. 428/411.1 |

(Continued)

FOREIGN PATENT DOCUMENTS

| | | |
|---|---|---|
| WO | WO 03/052837 | 6/2003 |
| WO | WO 2005/081789 | 9/2005 |
| WO | WO 2010/102057 | 9/2010 |

OTHER PUBLICATIONS

Song, Ki-Bong, et al., "Chalcogenide thin-film transistors using oxygenated n-type and p-type phase change materials". Applied Physics Letters 93, 043514 (2008), pp. 1-3.*

(Continued)

*Primary Examiner* — Bret Chen
(74) *Attorney, Agent, or Firm* — Kagan Binder, PLLC

(57) ABSTRACT

A layer of an n-type chalcogenide compositions including at least cadmium that is provided on a substrate in the presence of an oxidizing gas in an amount sufficient to provide a resistivity to the layer that is less than the resistivity a layer deposited under identical conditions but in the substantial absence of oxygen. Such n-type chalcogenide compositions are particularly useful in the making of photovoltaic devices.

15 Claims, 2 Drawing Sheets

(56) References Cited

U.S. PATENT DOCUMENTS

| | | |
|---|---|---|
| 2008/0090327 A1 | 4/2008 | Yamamoto et al. |
| 2008/0305269 A1 | 12/2008 | Sager et al. |
| 2009/0025640 A1 | 1/2009 | Sager et al. |
| 2009/0146141 A1* | 6/2009 | Song et al. ............... 257/42 |

OTHER PUBLICATIONS

Mytilineou, E., "Chalcogenide Amorphous Semiconductors: Chemical Modification or Doping?" Journal of Optoelectronic and Advanced Materials vol. 4, No. 3, Sep. 2002, pp. 705-710.*

* cited by examiner

MANUFACTURE OF N-TYPE CHALCOGENIDE COMPOSITIONS AND THEIR USES IN PHOTOVOLTAIC DEVICES

PRIORITY

The present non-provisional patent application claims benefit from U.S. Provisional Patent Application having Ser. No. 61/258,416, filed on Nov. 5, 2009, by Bryden et al., and titled MANUFACTURE OF N-TYPE CHALCOGENIDE COMPOSTIONS AND THEIR USES IN PHOTOVOLTAIC DEVICES, wherein the entirety of said provisional patent application is incorporated herein by reference.

FIELD OF THE INVENTION

This invention relates to the manufacture of n-type chalcogenide compositions, particularly n-type chalcogenide compositions incorporating sulfides and/or selenides of cadmium. Such compositions are of particular use in photovoltaic devices.

BACKGROUND

Compositions incorporating n-type chalcogenide compositions, particularly chalcogenides incorporating at least cadmium (Cd), have been used in photovoltaic devices as buffer layers in combination with p-type, photovoltaically active, chalcogenide compositions. Illustrative p-type, photovoltaically active chalcogenide compositions often include selenides and/or sulfides of at least one of copper, indium, and gallium, and even more typically at least two of these metals, and even all three of these. Such p-type materials are referred to as CIS, CISS, CIGS, and/or CIGSS compositions (collectively CIGS hereinafter), and the like.

For example, U.S. Patent Application Publication No 2005/0009228 A1 discloses a method for making a heterojunction photovoltaic device to convert solar radiation to photocurrent and photovoltage. The publication discloses the use of a window layer of CdS or an alloy of CdS that contains increased oxygen content. The window layer is deposited by a method that employs a gas mixture of an inert gas and oxygen at or near room temperature. The amount of oxygen used in the gas mixture is from about 1% to about 5% by volume.

U.S. Pat. No. 5,078,804 discloses a thin layer-based solar cell that has a first layer Cu/In/Ga/Se a second layer of Cd/Zn/S, a double layer of ZnO and a metallization structure comprised of a layer of Ni coated with a layer of Al. The Cd/Zn/S layer is deposited by an aqueous solution growth process.

U.S. Patent Application Publication No. 2005/0224111 A1 discloses a layered thin layer semiconductor device that comprises a first transparent layer, a thin second transparent layer that has a conductivity less than that of the first layer, an n-type layer, and a p-type layer. CdS is disclosed as useful in a CIGS or a CdTe photovoltaic device. However, the CdS is deposited by an aqueous process.

SUMMARY

The present invention provides methods for making n-type, chalcogenide compositions with reduced resistivity. The present invention is particularly applicable to sulfides and/or selenides incorporating at least cadmium and optionally one or more other constituents such as Zn, In, and combinations of these, and the like.

Surprisingly it has been discovered that the method of the invention reduces the resistivity (i.e., increases the conductivity) of an n-type chalcogenide composition, such as CdS or CdS alloys significantly relative to otherwise identical methods that use no oxygen or use 1% or more of an oxidizing gas. Indeed, fabricating these compositions using conventional levels of an oxidizing gas such as oxygen actually causes resistivity to increase dramatically (i.e., to cause conductivity to be reduced dramatically).

In accordance with the present invention, the compositions are fabricated by deposition from or through a gas phase in the presence of a limited amount (defined herein after) of an oxidizing gas to yield compositions with high conductivity. As a result, devices, such as photovoltaic devices, that employ an n-type chalcogenide composition made by the method(s) of the present invention may have better electronic performance and/or better efficiency.

In one aspect of the invention, a method of making an n-type chalcogenide composition is provided. The method comprises the steps of:

providing a substrate; and forming an n-type chalcogenide composition on a surface of the substrate in an oxidizing atmosphere comprising an oxidizing gas and, optionally at least one other gas, wherein the oxidizing gas is present in an amount such that the n-type composition formed has a resistivity less than the resistivity of an n-type chalcogenide composition formed in an otherwise identical process but in the substantial absence of the oxidizing gas.

Typically, the resistivity of the n-type chalcogenide composition provided according to the present invention is at least about 10 times less resistive, preferably at least 50 times less resistive, and more preferably at least 100 times less resistive. These compositions typically have a resistivity of less than about $1 \times 10^5$ ohm-cm.

In another aspect, the method of the invention comprises the steps of providing a substrate within a deposition chamber;

providing a target material comprising the n-type chalcogenide composition that comprises sulfides and/or selenides that incorporate at least cadmium and, optionally, one or more constituents selected from Zn, In, and combinations thereof; and depositing the n-type chalcogenide composition on a substrate in a gaseous oxidizing atmosphere comprising an oxidizing gas and, optionally at least one other gas, wherein the oxidizing gas is present in an amount such that the n-type chalcogenide composition formed has a resistivity less than the resistivity of an n-type chalcogenide composition formed in an otherwise identical process but in the substantial absence of the oxidizing gas.

In yet another aspect of the invention, a photovoltaic article is provided. The photovoltaic device comprises:

a substrate having a p-type photovoltaic composition; and a layer of an n-type chalcogenide composition incorporated into the substrate, the n-type chalcogenide composition being formed in an oxidizing atmosphere comprising an oxidizing gas and, optionally at least one other gas, wherein the oxidizing gas is present in an amount such that the n-type chalcogenide composition formed has a resistivity less than the resistivity of an n-type chalcogenide composition formed in an otherwise identical process but in the substantial absence of the oxidizing gas.

Oxidizing gasses that may be employed in the oxidizing atmosphere include, but are not limited to, oxygen, nitrous oxide, water vapor, ozone, and the like. Combinations of these oxidizing gasses may be employed if desired. Oxygen is the preferred oxidizing gas.

The other gasses that may be employed in the oxidizing atmosphere include, but are not limited to, inert gasses such as nitrogen, and the noble gasses. Argon is the preferred other gas although other noble gasses such as krypton and helium may be used if desired.

In the present invention, the phrase "substantial absence of the oxidizing gas", means there is less than about 0.001% of the oxidizing gas present.

In one aspect of the invention, the oxidizing gas comprises from at least about 0.001 mole %, more preferably greater than about 0.01, more preferably still greater than 0.05 mole % and up to about 0.7 mole %, more preferably up to about 0.3 mole % and most preferably up to about 0.25 mole % of the oxidizing atmosphere at a pressure of less than about 100 mTorr.

In another aspect of the invention, the partial pressure of the oxidizing gas employed in the oxidizing atmosphere is less than about 0.5 mTorr, preferably less than 0.3 mTorr, more preferably in the range of from about 0.005 mTorr o about 0.05 mTorr.

The pressure of the oxidizing atmosphere employed in the present invention is typically less than about 100 mTorr. Preferably the pressure of the oxidizing atmosphere employed in the present invention is in the range of from about 0.01 mTorr to about 50 mTorr, and more preferably from about 5 mTorr to about 20 mTorr.

DESCRIPTION OF THE DRAWINGS

The present invention is further illustrated in the attached drawings in which.

DETAILED DESCRIPTION

Figure 1:
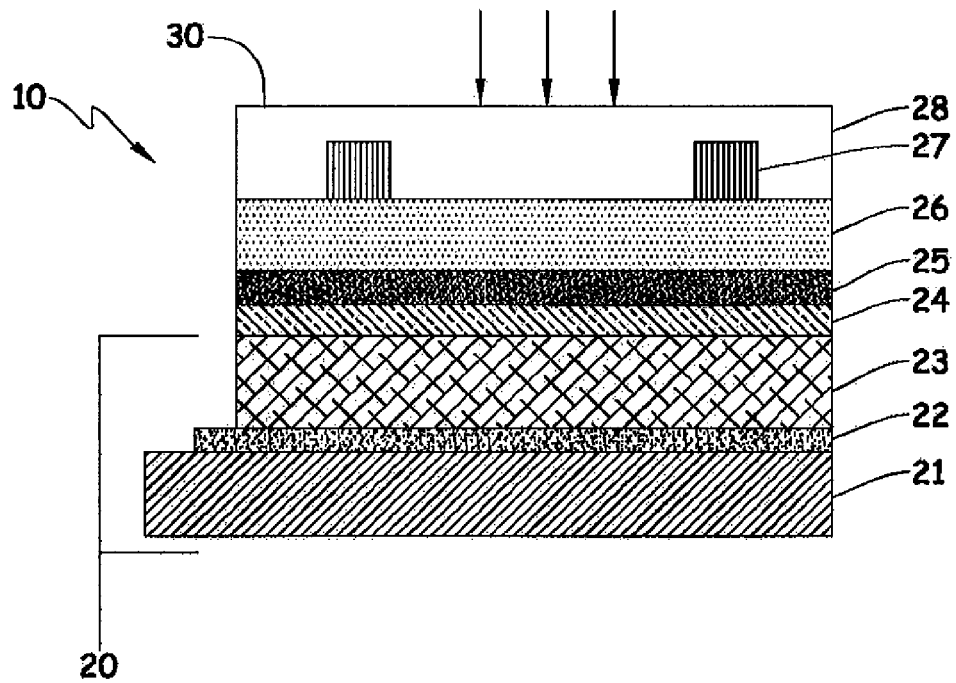
FIG. 1 is a schematic representation of an article prepared according to the present invention.

The following description is made with respect to a representative embodiment of the invention, in particular a thin film photovoltaic device. While the present invention is described with respect to this device, it is understood that it is not intended to limit the invention to that embodiment. To the contrary, the present invention is intended to cover the all alternatives, modifications, and equivalents that may be included within the scope of the invention as defined by the claims.

One skilled in the art will recognize many methods and materials similar or equivalent to those described herein, which could be used in and are within the scope of the practice of the present invention. The present invention is in no way limited to the specific methods and materials described.

All publications and patents mentioned herein are incorporated herein by reference in their respective entireties for the purpose of describing and disclosing, for example, the constructs and methodologies that are described in the publications which might be used in connection with the presently described invention. The publications discussed above and throughout the text are provided solely for their disclosure prior to the filing date of the present application. Nothing herein is to be construed as an admission that the inventor is not entitled to antedate such disclosure by virtue of prior invention.

Unless defined otherwise, technical and scientific terms used herein have the same meaning as commonly understood by one of ordinary skill in the art to which this invention belongs. Although any methods, devices, and materials similar or equivalent to those described herein can be used in the practice or testing of the invention, the preferred methods, devices and materials are now described.

The present invention provides methodologies in which a layer of an n-type chalcogenide composition is deposited onto a substrate with improved conductivity. For purposes of discussion, the methods will be described in the context of fabricating an n-type CdS composition, but it is understood that the present invention is applicable to other n-type chalcogenide compositions. As used herein, an n-type chalcogenide composition refers to an n-type composition incorporating one or more Group 16 elements, particularly n-type oxides, selenides, and/or sulfide, preferably selenides and/or sulfides. Examples of n-type chalcogenide compositions include chalcogenides of one or more of cadmium, zinc, indium, combinations of these, and the like. Cadmium sulfide and/or cadmium zinc sulfide are preferred n-type chalcogenide compositions.

The methods involved providing a substrate onto which the n-type chalcogenide composition is formed. This often involves placing, affixing, or otherwise positioning the substrate into a deposition system, usually a chamber. A wide variety of substrates can be used. In those embodiments in which the substrate is to be a component of a photovoltaic device, the substrate may incorporate any kind of photovoltaic functional layers, including those based on silicon, germanium, p-type chalcogenides, combinations of these, and the like. The substrate can also be a component to be incorporated into other kinds of microelectronic devices, including but not limited to thin film batteries, displays, sensors, and the like. In many embodiments, the substrate includes a p-type chalcogenide photovoltaic absorber, and the n-type composition chalcogenide composition is deposited onto the surface of the p-type material to form a p-n junction.

The substrate can be rigid or flexible. A distinct advantage of CIGS-based photovoltaic devices is their flexibility. A typical CIGS absorber composition has a very high cross-section for capturing incident light. Accordingly, these layers can be made thin enough to form flexible photovoltaic devices. In such embodiments, the substrate desirably is sufficiently flexible to be wrapped around a mandrel having a diameter of 50 cm, preferably about 40 cm, more preferably about 25 cm without cracking at a temperature of 25° C.

The deposition through or from gaseous phase can be carried out using a wide variety of deposition techniques. Exemplary techniques include sputtering (e.g., physical sputtering, reactive sputtering, direct current sputtering, radio frequency (RF) sputtering (both with and without magnetron sputtering), triode sputtering, ion beam sputtering), evaporation, cathodic arc deposition, pulsed laser deposition or other laser ablation technique, molecular beam epitaxy, topotaxy, other physical vapor deposition, chemical vapor deposition, plasma enhanced chemical vapor deposition, Atomic layer deposition, or the like. Preferred deposition techniques include evaporation, sputtering, chemical vapor deposition, and atomic layer deposition.

During the course of the deposition, a limited amount of oxidizing gas, as described above, is introduced that is effective to provide an n-type chalcogenide composition having greater conductivity than an n-type chalcogenide composition formed by an otherwise identical process in the substantial absence of oxygen, and preferably without oxygen being introduced. By limiting the oxygen in this way, the conductivity of the resultant composition tends to be higher than if an otherwise identical process were carried out in the absence of oxygen or in the presence of more oxygen. In one mode of practice, the amount of oxidizing gas can be suitably limited by co-introducing the oxidizing gas with one or more other gases in which the relative amount of the oxidizing gas is suitably limited as described above. A wide variety of other gases may be co-introduced with oxygen to form the desired n-type chalcogenide composition. In some modes, one or more inert carrier gases may be co-introduced with the oxidizing gas. Examples of these inert carrier gases include have been described above The gas mixture used in the present invention can be controlled and monitored by a variety of means. For example, the inert gas and the oxidizing gas may be combined and mixed prior to entering the chamber. Alternatively, the gasses may be mixed upon entering the deposition chamber with the aid of a gas distributor. Measurement, characterization, and control of the gas mixture may be performed externally or internally by utilizing numerous techniques commonly known within the art. In some cases the mixture of gasses may be measured by mass flow rate.

In addition to limiting the relative amount of oxidizing gas in the chamber, it may also be desirable to limit the actual total amount of oxidizing gas that flows through the chamber during the deposition. This can be accomplished easily by not only limiting the relative amount of oxidizing gas but also by choosing a suitable overall operating pressure that keeps the overall level of oxidizing gas below a desired threshold amount. The deposition can be carried out at any suitable temperature. The temperature will depend upon factors such as the deposition technique being used, the nature of the substrate, the desired composition of the n-type composition, the nature of the target, or the like.

Sputter deposition is preferred. In such deposition approach, the substrate is typically fixed to or otherwise supported upon a holder within the chamber such as by gripping components, vacuum, or the like. However, the substrate may be oriented and affixed by a wide variety of means as desired. The substrate may be provided in the chamber in a manner such that the substrate is stationary and/or non-stationary during the treatment. In some embodiments, for instance, the substrate can be supported on a rotatable chuck so that the substrate rotates during the deposition.

One or more targets are operably provided in the deposition system. The targets are compositionally suitable to form the desired n-type chalcogenide composition. For instance, to form n-type cadmium sulfide, a suitable target has a composition that includes cadmium and sulfur-containing compounds, and is preferably 99% pure.

The substrate may be placed at a predetermined distance from and orientation relative to the target(s). In some modes of practice, this distance can be varied during the course of the deposition, if desired. Typically, the distance is in the range from about 50 millimeters (mm) to about 100 mm. Preferably, the distance is from about 60 mm to about 80 mm. Prior to starting deposition, the chamber typically is evacuated to a suitable base pressure. In many embodiments, the base pressure is in the range from about $1\times10^{-8}$ Torr to about $1\times10^{-6}$ Torr.

Conveniently, many modes of practice may be carried out at a temperature in the range of from about 20° C. to about 30° C. Conveniently, many modes of practice may be carried out under ambient temperature conditions. Of course, cooler or warmer temperatures may be used to help control deposition rate, deposition quality, or the like. The deposition may be carried out long enough to provide a layer of n-type material have a desired thickness, uniformity, and/or the like. In exemplary embodiments, the n-type layer has a thickness in the range from about 10 nanometers (nm) to about 200 nm.

Figure 2:
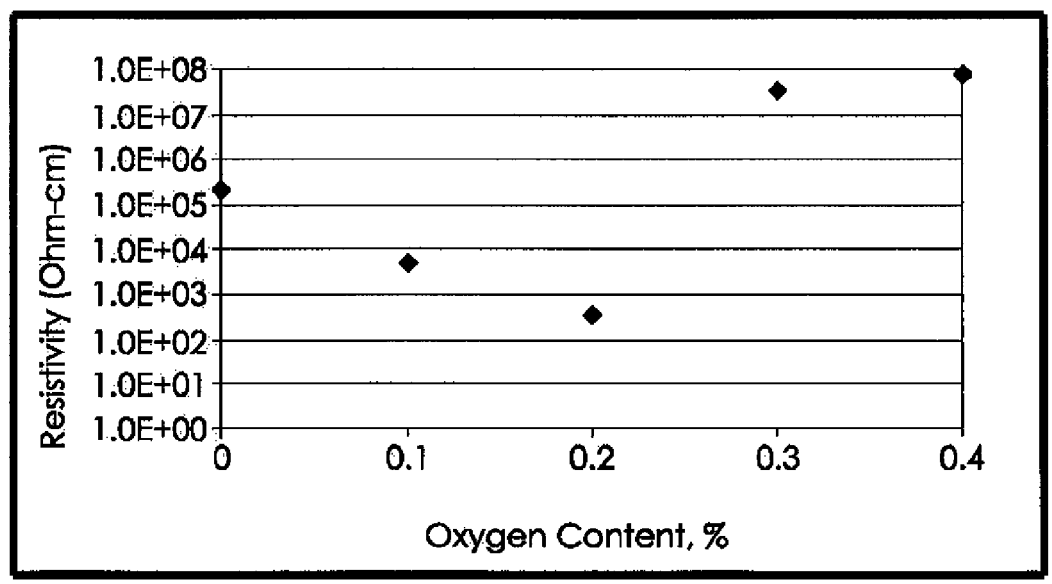
FIG. 2 is a plot of the resistivity of a layer of sputtered CdS vs. the oxygen content (in mole %) of the gas present in the deposition chamber.

FIG. 1 shows one embodiment of a photovoltaic article 10 that may be made by processes of the invention. This article 10 comprises a substrate 20 incorporating a support 21, a backside electrical contact 22, and a chalcogenide absorber 23. The article 10 further includes a buffer region 24 incorporating an n-type chalcogenide composition of the present invention, an optional front side electrical contact window region 25, a transparent conductive oxide region 26, a collection grid 27, and an optional barrier region 28 to help protect and isolate the article 10 from the ambient. Each of these components is shown in FIG. 2 as including a single layer, but any of these independently can be formed from multiple sublayers as desired. Additional layers (not shown) conventionally used in photovoltaic cells as presently known or hereafter developed may also be provided. As used occasionally herein, the top 30 of the cell is deemed to be that side which receives the incident light 32.

The support 21 may be a rigid or flexible substrate as discussed previously. Support 21 may be formed from a wide range of materials. These include glass, quartz, other ceramic materials, polymers, metals, metal alloys, intermetallic compositions, paper, woven or non-woven fabrics, combinations of these, and the like. Stainless steel is preferred.

The backside electrical contact 22 provides a convenient way to electrically couple article 10 to external circuitry. Contact 22 may be formed from a wide range of electrically conductive materials, including one or more of Cu, Mo, Ag, Al, Cr, Ni, Ti, Ta, Nb, W combinations of these, and the like. Conductive compositions incorporating Mo may be used in an illustrative embodiment. The backside electrical contact 22 also helps to isolate the absorber 23 from the support 21 to minimize migration of support constituents into the absorber 23. For instance, backside electrical contact 22 can help to block the migration of Fe and Ni constituents of a stainless steel support 21 into the absorber 23. The backside electrical contact 22 also can protect the support 21 such as by protecting against Se if Se is used in the formation of absorber 23. The chalcogenide absorber 23 preferably incorporates at least one p-type Group 16 chalcogenide, such as Group 16 selenides, sulfides, and selenides-sulfides that include at least one of copper, indium, and/or gallium. In many embodiments, these materials are present in polycrystalline form. Advantageously, these materials exhibit excellent cross-sections for light absorption that allow absorber 23 to be very thin and flexible. In illustrative embodiments, a typical absorber region 23 may have a thickness in the range from about 300 nm to about 3000 nm, preferably about 1000 nm to about 2000 nm.

Representative examples of such p-type chalcogenides incorporate one or more of copper, indium, and or gallium in addition to selenium and/or sulfur. Some embodiments include sulfides or selenides of copper and indium. Additional embodiments include selenides or sulfides of copper, indium, and gallium. Specific examples include but are not limited to copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGS) materials. In representative embodiments, CIGGS materials with photovoltaic properties may be represented by the formula $CuIn_{(1-x)}Pa_x Se_{(2-y)}S_y$, where x is 0 to 1 and y is 0 to 2. The copper indium selenides and copper indium gallium selenides are preferred. The absorber 23 may be formed by any suitable method using a variety of one or more techniques such as evaporation, sputtering, electro deposition, spraying, and sintering. One preferred method is co-evaporation of the constituent elements from one or more suitable targets, where the individual constituent elements are thermally evaporated on a hot surface coincidentally at the same time, sequentially, or a combination of these to form absorber 23. After deposition, the deposited materials may be subjected to one or more further treatments to finalize the absorber properties. Optional layers (not shown) may be used on substrate 20 in accordance with conventional practices now known or hereafter developed to help enhance adhesion between backside electrical contact 22 and the support 21 and/or between backside electrical contact 22 and the absorber region 23. Additionally, one or more barrier layers (not shown) also may be provided over the backside of support 21 to help isolate device 10 from the ambient and/or to electrically isolate device 10. The buffer region 24 incorporates at least an n-type chalcogenide formed at least in part using the principles of the invention as described herein. A preferred buffer layer 24 includes CdS. Although shown as having a single layer, region 24 can be formed from one or more sublayers.

Optional window region 25, which may be a single layer or formed from multiple sublayers, can help to protect against shunts. Window region 25 also may protect buffer region 24 during subsequent deposition of the TCO region 26. The window region 25 may be formed from a wide range of materials and often is formed from a resistive, transparent oxide such as an oxide of Zn, In, Cd, Sn, combinations of these and the like. An exemplary window material is intrinsic ZnO. A typical window region 25 may have a thickness in the range from about 1 nm to about 200 nm, preferably about 10 nm to about 150 nm, more preferably about 80 to about 120 nm.

The TCO region 26, which may be a single layer or formed from multiple sublayers, is electrically coupled to the buffer region 24 to provide a top conductive electrode for article 10. In many suitable embodiments, the TCO region 26 has a thickness in the range from about 10 nm to about 1500 nm, preferably about 150 nm to about 200 nm. As shown, the TCO region 26 is in direct contact with the window region 25, but one or more intervening layers optionally may be interposed for a variety of reasons such as to promote adhesion, enhance electrical performance, or the like.

A wide variety of transparent conducting oxides or combinations of these may be incorporated into the TCO region 26. Examples include fluorine-doped tin oxide, tin oxide, indium oxide, indium tin oxide (ITO), aluminum doped zinc oxide (AZO), zinc oxide, combinations of these, and the like. In one illustrative embodiment, TCO region 30 has a dual layer construction in which a first sublayer proximal to the buffer incorporates zinc oxide and a second sublayer incorporates ITO and/or AZO. TCO layers are conveniently formed via sputtering or other suitable deposition technique.

The optional electron grid collection structure 27 may be deposited over the TCO region 26 to reduce the sheet resistance of this layer. The grid structure 27 preferably incorporates one or more of Ag, Al, Cu, Cr, Ni, Ti, Ta, TiN, TaN, and combinations thereof. Preferably the grid is made of Ag. An optional film of Ni (not shown) may be used to enhance adhesion of the grid structure to the TCO region 26. This structure can be formed in a wide variety of ways, including being made of a wire mesh or similar wire structure, being formed by screen-printing, ink-jet printing, electroplating, photolithography, and metallizing thru a suitable mask using any suitable deposition technique.

A chalcogenide based photovoltaic cell may be rendered less susceptible to moisture related degradation via direct, low temperature application of suitable barrier protection 28 to the top 30 of the photovoltaic article 10. The barrier protection may be a single layer or multiple sublayers.

EXAMPLE(S)

The following example(s) are provided to further illustrate the present invention.

A number of soda lime glass substrates were provided and sonicated in an alkaline detergent followed by rinsing in 2-propanol. The substrates were blown dry using nitrogen. A molybdenum layer was sputter deposited onto the sonicated surface of each of the substrates using conditions well known in the art to provide a molybdenum layer having a thickness of about 700 nanometers on each. A thin CdS layer was then sputter deposited onto each of the molybdenum layers using the following conditions: Power; 3 W/cm$^2$; Pressure 15 mTorr; Target to substrate distance=70 mm; % Oxygen=various levels from 0 mole % to 0.4 mole % (balance argon). Each of the resulting CdS layers was about 100 nm thick.

Silver contact pads having a thickness of 1.5 μm and a diameter of 125 μm were then applied to each of the CdS layers. A series of potentials was then applied between the silver contact pads and the underlying molybdenum layer and the current at each voltage was measured. From the currents at each potential, a resistivity of the CdS layer was calculated for each CdS layer prepared at each oxygen level. FIG. 2 shows the resistivity of each CdS layer as a function of the concentration of oxygen used during sputter deposition of the CdS layer. As can be seen in FIG. 2, the use of oxygen concentrations of between about 0.1 mole % and 0.3 mole % during deposition resulted in dramatically reduced resistivity in the CdS layer.

Depth profile X-ray photoelectron spectroscopy (XPS) was used to analyze the composition of the various CdS layers. Such techniques are known and are described in "Practical Surface Analysis: Auger and X-Ray Photoelectron Spectroscopy" by D. Briggs and M. Seah, 1996.

Figure 3:
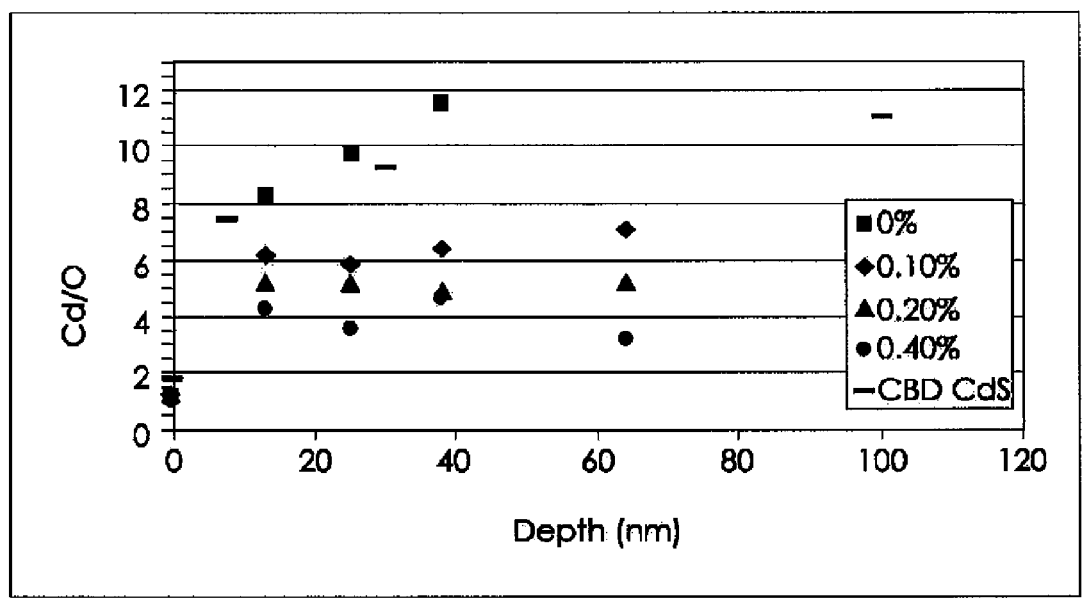
FIG. 3 is an XPS depth profile showing the Cd/O ratio vs. depth into the CdS layer. The percentages shown are mole percentages.

FIG. 3 shows the ratio of Cd to oxygen (Cd/O) as a function of depth within the CdS layer from the surface to the CdS/molybdenum interface for different levels of oxygen used in during sputter deposition of the CdS layers. FIG. 3 also shows the Cd/O ratio for a CdS layer deposited by a standard chemical bath deposition process (CBD). As the Cd/O ratio increases, the level of oxygen in the CdS layer decreases. As can be seen if FIG. 3, higher levels of oxygen used during deposition of the CdS layer provide a lower Cd/O ratio (i.e., a higher level of oxygen) in the CdS layer.

FIG. 3 also shows data points identified as CBD CdS. These data points show the level of oxygen present in a CdS layer deposited via a known chemical deposition process. As can be seen, this CdS layer has virtually no oxygen in it below the surface of the layer.

What is claimed is:

1. A method of making an n-type chalcogenide composition within structure of a photovoltaic device comprising the steps of:
   providing a substrate; and
   forming an n-type chalcogenide composition comprising at least one sulfide and/or at least one selenide that incorporate at least cadmium on a surface of the substrate in an oxidizing atmosphere comprising an oxidizing gas and at least one other gas, wherein the oxidizing atmosphere has a pressure less than 100 mTorr and wherein the oxidizing gas comprises from 0.001 mol % to 0.7 mol % of the oxidizing atmosphere.

2. The method of claim 1, wherein the oxidizing atmosphere comprises from about 0.05 mole % to about 0.7 mole % of the oxidizing gas at a pressure of less than about 100 mTorr.

3. The method of claim 1, wherein the oxidizing atmosphere is at a pressure is in the range of from about 5 to about 20 mTorr.

4. The method of claim 1, wherein the oxidizing atmosphere comprises from about 0.05 mole % to an about 0.3 mole % of the oxidizing gas.

5. The method of claim 1, wherein the oxidizing atmosphere comprises less than about 0.25 mole % of the oxidizing gas.

6. The method of claim 1, wherein the partial pressure of the oxidizing gas in the oxidizing atmosphere is less than about 0.5 mTorr.

7. The method of claim 6, wherein the partial pressure of the oxidizing gas in the oxidizing atmosphere is less than about 0.3 mTorr.

8. The method of claim 1, wherein the oxidizing gas is selected from oxygen, water vapor, nitrous oxide, and ozone.

9. The method of claim 1, wherein the n-type chalcogenide composition further comprises one or more constituents selected from Zn, In, and combinations thereof.

10. The method of claim 1, wherein the at least one other gas is selected from nitrogen, a noble gas and combinations thereof.

11. The method of claim 1, wherein the oxidizing atmosphere comprises oxygen and a noble gas.

12. The method of claim 1, wherein the n-type chalcogenide composition comprises cadmium and sulfur.

13. The method of claim 1, wherein;
the substrate comprises a p-type photovoltaic composition; and
the n-type chalcogenide composition is in electrical contact with a surface of the p-type photovoltaic composition.

14. The method of claim 1, wherein the n-type chalcogenide composition is formed by evaporation, sputtering, chemical vapor deposition, or atomic layer deposition.

15. The method of claim 1, wherein the n-type chalcogenide composition is formed by sputtering.

* * * * *